(12) United States Patent
Ting et al.

(10) Patent No.: US 10,354,949 B2
(45) Date of Patent: Jul. 16, 2019

(54) AIR GAP STRUCTURE AND METHOD

(71) Applicant: Taiwan Semiconductor Manufacturing Company, Ltd., Hsinchu (TW)

(72) Inventors: Chih-Yuan Ting, Taipei (TW); Jyu-Horng Shieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/893,050

(22) Filed: Feb. 9, 2018

(65) Prior Publication Data

US 2018/0174961 A1    Jun. 21, 2018

Related U.S. Application Data

(62) Division of application No. 14/497,052, filed on Sep. 25, 2014, now Pat. No. 9,991,200.

(51) Int. Cl.
| | |
|---|---|
| *H01L 23/522* | (2006.01) |
| *H01L 23/532* | (2006.01) |
| *H01L 21/768* | (2006.01) |
| *H01L 21/311* | (2006.01) |

(52) U.S. Cl.
CPC .... *H01L 23/5226* (2013.01); *H01L 21/31144* (2013.01); *H01L 21/7682* (2013.01); *H01L 21/76808* (2013.01); *H01L 21/76831* (2013.01); *H01L 23/5222* (2013.01); *H01L 23/5329* (2013.01); *H01L 23/53295* (2013.01); *H01L 21/76832* (2013.01); *H01L 21/76834* (2013.01); *H01L 23/53223* (2013.01); *H01L 23/53238* (2013.01); *H01L 23/53252* (2013.01); *H01L 23/53266* (2013.01); *H01L 2924/0002* (2013.01)

(58) Field of Classification Search
CPC combination set(s) only.
See application file for complete search history.

(56) References Cited

U.S. PATENT DOCUMENTS

| | | | |
|---|---|---|---|
| 7,285,474 B2 | 10/2007 | Anderson et al. | |
| 7,842,615 B2 | 11/2010 | Park | |
| 9,123,727 B2 | 9/2015 | Fischer | |
| 2009/0093100 A1 | 4/2009 | Xia et al. | |
| 2009/0305480 A1 | 12/2009 | Sasahara et al. | |
| 2010/0327446 A1 | 12/2010 | Yang et al. | |
| 2011/0198757 A1 | 8/2011 | Su et al. | |

(Continued)

FOREIGN PATENT DOCUMENTS

| | | |
|---|---|---|
| CN | 101431047 A | 5/2009 |
| CN | 102163592 A | 8/2011 |

(Continued)

*Primary Examiner* — Tony Tran
(74) *Attorney, Agent, or Firm* — Slater Matsil, LLP

(57) ABSTRACT

A device comprises a first protection layer over sidewalls and a bottom of a first trench in a first dielectric layer, a first barrier layer over the first protection layer, a first metal line in the first trench, a second protection layer over sidewalls and a bottom of a second trench in the first dielectric layer, a second barrier layer over the second protection layer, a second metal line in the first trench, an air gap between the first trench and the second trench and a third protection layer over sidewalls of a third trench in the first dielectric layer, wherein the first protection layer, the second protection layer and the third protection are formed of a same material.

20 Claims, 20 Drawing Sheets

(56) References Cited

U.S. PATENT DOCUMENTS

2011/0221062 A1    9/2011   Clevenger et al.
2012/0032323 A1    2/2012   Matsumoto et al.
2013/0323930 A1   12/2013   Chattopadhyay et al.

FOREIGN PATENT DOCUMENTS

| | | | |
|---|---|---|---|
| JP | 2009123733 | A | 6/2009 |
| JP | 2012134422 | A | 7/2012 |
| JP | 2013149679 | A | 8/2013 |
| KR | 20090011201 | A | 2/2009 |
| KR | 20110001894 | A | 1/2011 |
| KR | 20120027114 | A | 3/2012 |
| TW | 200939394 | A | 9/2009 |
| TW | 201017819 | A | 5/2010 |
| TW | 201349307 | A | 12/2013 |
| TW | 201409614 | A | 3/2014 |
| WO | 2013040751 | A1 | 3/2013 |

AIR GAP STRUCTURE AND METHOD

PRIORITY CLAIM AND CROSS-REFERENCE

This application is division of U.S. application Ser. No. 14/497,052, filed on Sep. 25, 2014, and entitled "Air Gap Structure and Method," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package structures have emerged as an effective alternative to further reduce the physical size of semiconductor devices. In a wafer-level chip scale package structure, active devices such as transistors and the like are formed at the top surface of a substrate of the wafer-level chip scale package structure. A variety of metallization layers comprising interconnect structures are formed over the substrate. Interconnection structures of a semiconductor device may comprise a plurality of lateral interconnections such as metal lines and a plurality of vertical interconnections such as vias, plugs and/or the like. The metal lines of the metallization layers are separated by dielectric layers. Trenches and vias are formed in the dielectric layers to provide an electrical connection between metal lines. Various active circuits of a semiconductor device may be coupled to external circuits through a variety of conductive channels formed by the vertical and lateral interconnections.

The metal lines and vias may be formed of copper. In order to prevent interference such as capacitive coupling between two adjacent metal lines from having an impact on the overall performance of the semiconductor device, low-K dielectric materials may be filled between adjacent metal lines. The low-K dielectric materials may be of a dielectric constant approximately equal to and less than 4.0. Furthermore, air gaps may be employed to further reduce capacitive coupling so as to improve the overall performance characteristics of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
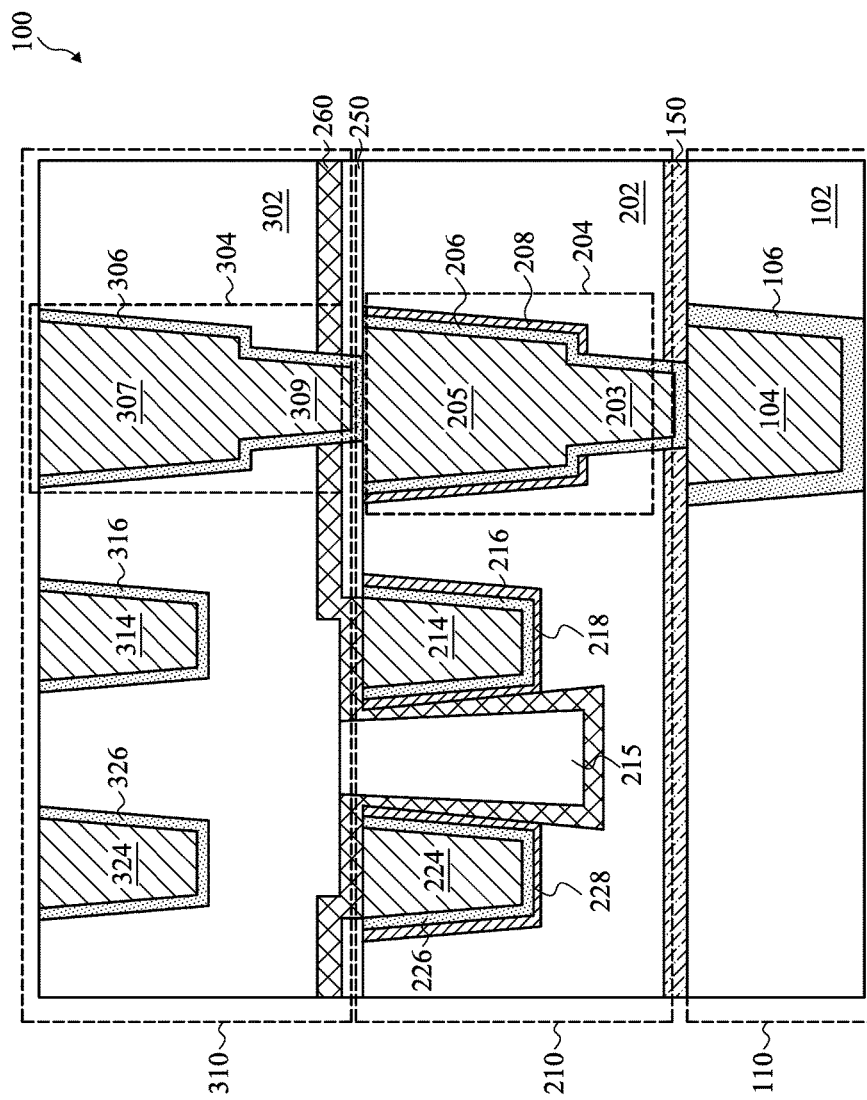
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross sectional view of a semiconductor device in accordance with various embodiments of the present disclosure. The semiconductor device 100 includes a first dielectric layer 102, a second dielectric layer 202 and a third dielectric layer 302. The first dielectric layer 102 may be formed over a substrate (not shown). In some embodiments, the first dielectric layer 102 and its associated metal structures are part of a first metallization layer 110 over the substrate. Likewise the second dielectric layer 202 and the third dielectric layer 302 are part of a second metallization layer 210 and a third metallization layer 310 respectively.

In some embodiments, the first dielectric layer 102, the second dielectric layer 202 and the third dielectric layer 302 may be formed of a same dielectric material. For example, the first dielectric layer 102, the second dielectric layer 202 and the third dielectric layer 302 may be formed of a low-K dielectric material, such as silicon oxide. The dielectric layers (e.g., first dielectric layer 102) may be formed by any suitable method known in the art, such as spinning, chemical vapor deposition (CVD), plasma enhanced CVD (PECVD) and/or the like. It should be noted that one skilled in the art will recognize while FIG. 1 illustrates a single dielectric layer (e.g., the first dielectric layer 102), each dielectric layer may comprise a plurality of dielectric layers.

As shown in FIG. 1, there may be a metal line 104 formed in the first dielectric layer 102. The metal line 104 is surrounded by a barrier layer 106. In other words, the barrier layer 106 wraps the metal line 104 around three sides as shown in FIG. 1. The barrier layer 106 prevents the metal of the metal line 104 from diffusing into the first dielectric layer 102. It should be recognized that while FIG. 1 illustrates the first dielectric layer 102 having a single metal line (e.g., metal line 104), the first dielectric layer 102 could accommodate any number of metal lines.

The second dielectric layer 202 is formed over the first dielectric layer 102 as shown in FIG. 1. The second dielectric layer 202 comprises three metal structures 204, 214 and 224. The first metal structure 204 includes an upper portion 205 and a lower portion 203. In some embodiments, the upper portion 205 of the first metal structure 204 is a metal line. The lower portion 203 of the first metal structure 204 is a via. Throughout the description, the upper portion 205 and the lower portion 203 may be alternatively referred to as the metal line 205 and the via 203 respectively.

As shown in FIG. 1, the lower portion 203 of the first metal structure 204 is surrounded by a barrier layer 206. The bottom portion of the barrier layer 206 is in direct contact with a top surface of the metal line 104. The upper portion 205 of the first metal structure 204 and the second dielectric layer 202 are separated by a barrier layer 206 and a first protection layer 208. As shown in FIG. 1, the first protection layer 208 is formed along sidewalls of the upper portion 205. In addition, the first protection layer 208 extends from a corner of the upper portion 205 to a sidewall of the lower portion 203.

The second metal structure 214 and the third metal structure 224 are metal lines according to some embodiments. Throughout the description, the second metal structure 214 and the third metal structure 224 may be alternatively referred to as the metal lines 214 and 224 respectively.

The second metal structure 214 is surrounded by a barrier layer 216 and a second protection layer 218. Likewise, the third metal structure 224 is surrounded by a barrier layer 226 and a third protection layer 228. In some embodiments, the first protection layer 208, the second protection layer 218 and the third protection layer 228 are formed of a same material. The formation process of the first protection layer 208, the second protection layer 218 and the third protection layer 228 will be described below with respect to FIGS. 2-17.

In some embodiments, the metal structures 204, 214 and 224 may be formed of suitable metal materials such as copper, copper alloys, aluminum, silver, tungsten, gold, any combinations thereof and/or the like.

As shown in FIG. 1, there is an air gap 215 formed between the second metal structure 214 and the third metal structure 224. A liner layer 260 is formed on sidewalls and a bottom of the air gap 215. The top terminal of the air gap 215 is covered by the third dielectric layer 302. The detailed formation process of the air gap 215 will be described below with respect to FIGS. 12-16.

It should be noted that while FIG. 1 illustrates one air gap (e.g., air gap 215) is formed in the second metallization layer 210, the semiconductor device 100 could accommodate any number of air gaps. The air gap 215 is illustrated for simplicity.

The third dielectric layer 302 is formed over the second dielectric layer 202. The third dielectric layer 302 is part of the third metallization layer 310. As shown in FIG. 1, there may be three metal structures 304, 314 and 324 formed in the third metallization layer 310. As shown in FIG. 1, the metal structure 304 comprises a metal line 307 and a via 309. The via 309 is coupled between the metal line 204 and the metal line 307. In some embodiments, the via 309 and the metal line 307 may be formed through suitable semiconductor fabrication processes such as a dual damascene process.

While FIG. 1 shows three metallization layers (e.g., metallization layers 110, 210 and 310), one skilled in the art will recognize that more inter-metal dielectric layers (not shown) and the associated metal lines and vias (not shown) may be formed over the metallization layers (e.g., metallization layer 310). In particular, the additional layers may be formed by alternating layers of dielectric (e.g., extremely low-k dielectric material) and conductive materials (e.g., copper).

FIG. 1 further illustrates the semiconductor device 100 comprises an etch stop layer 150. The etch stop layer 150 is formed over the first dielectric layer 102. In some embodiments, the etch stop layer 150 may be employed to provide etching selectivity. The etch stop layer 150 may be a dielectric material such as such as silicon nitride, silicon oxynitride, silicon oxycarbide, silicon carbide, combinations thereof, and multi-layers thereof. In some embodiments, the etch stop layer 150 may be formed using a suitable deposition process such as CVD, PECVD, atomic layer deposition (ALD) and/or the like. The etch stop layer 150 may be of a thickness in a range from about 300 Angstroms to about 1,500 Angstroms.

Figure 2:
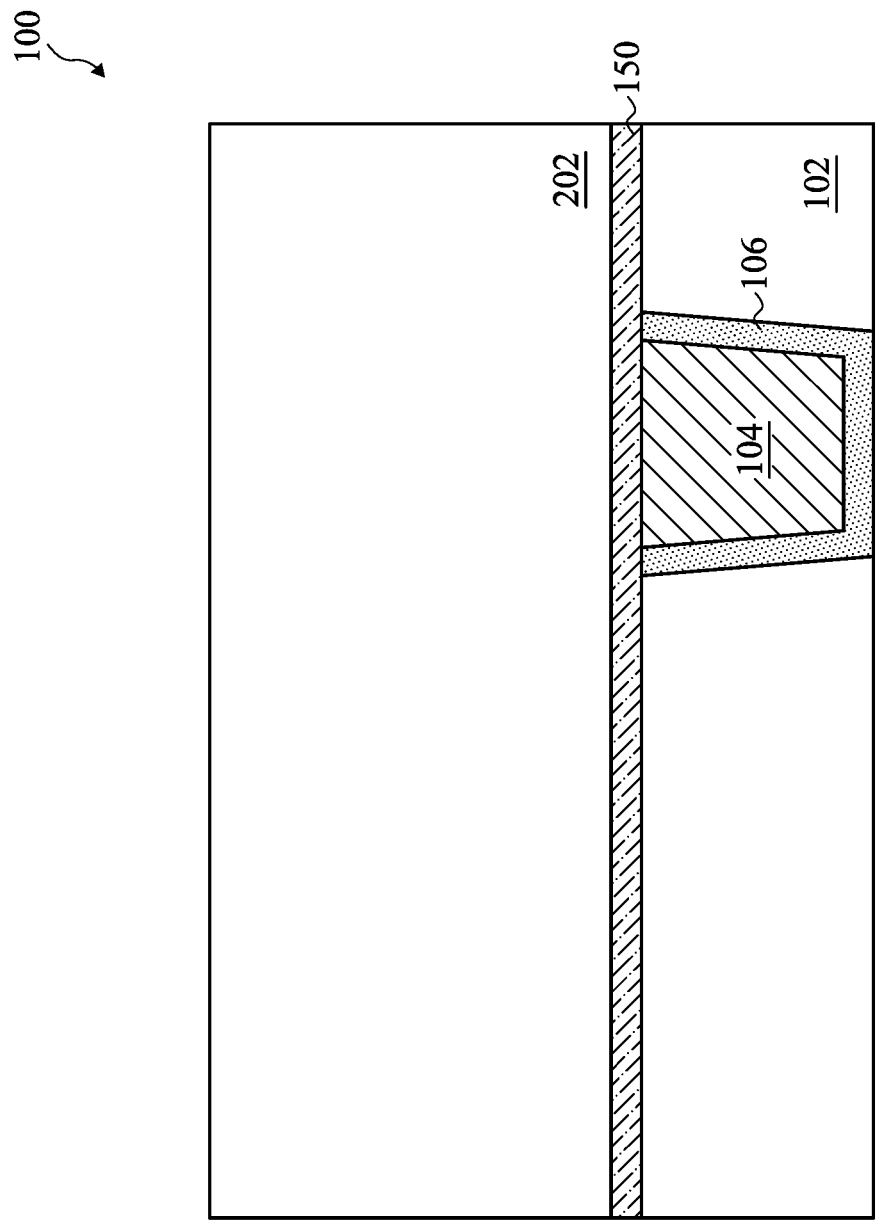
FIG. 2 illustrates a cross sectional view of a dielectric layer formed over an etching stop layer in accordance with various embodiments of the present disclosure.

FIGS. 2 to 17 illustrate intermediate steps of fabricating the semiconductor device shown in FIG. 1 in accordance with various embodiments of the present disclosure. FIG. 2 illustrates a cross sectional view of a dielectric layer formed over an etching stop layer in accordance with various embodiments of the present disclosure. The etching stop layer 150 is formed over the first dielectric layer 102. The second dielectric layer 202 is formed over the etching stop layer 150. The second dielectric layer 202 may be formed of a low-K dielectric material such as fluorosilicate glass (FSG) and/or the like. The second dielectric layer 202 may be formed by suitable deposition techniques such as PECVD techniques, high-density plasma chemical vapor deposition (HDPCVD) and/or the like.

Figure 3:
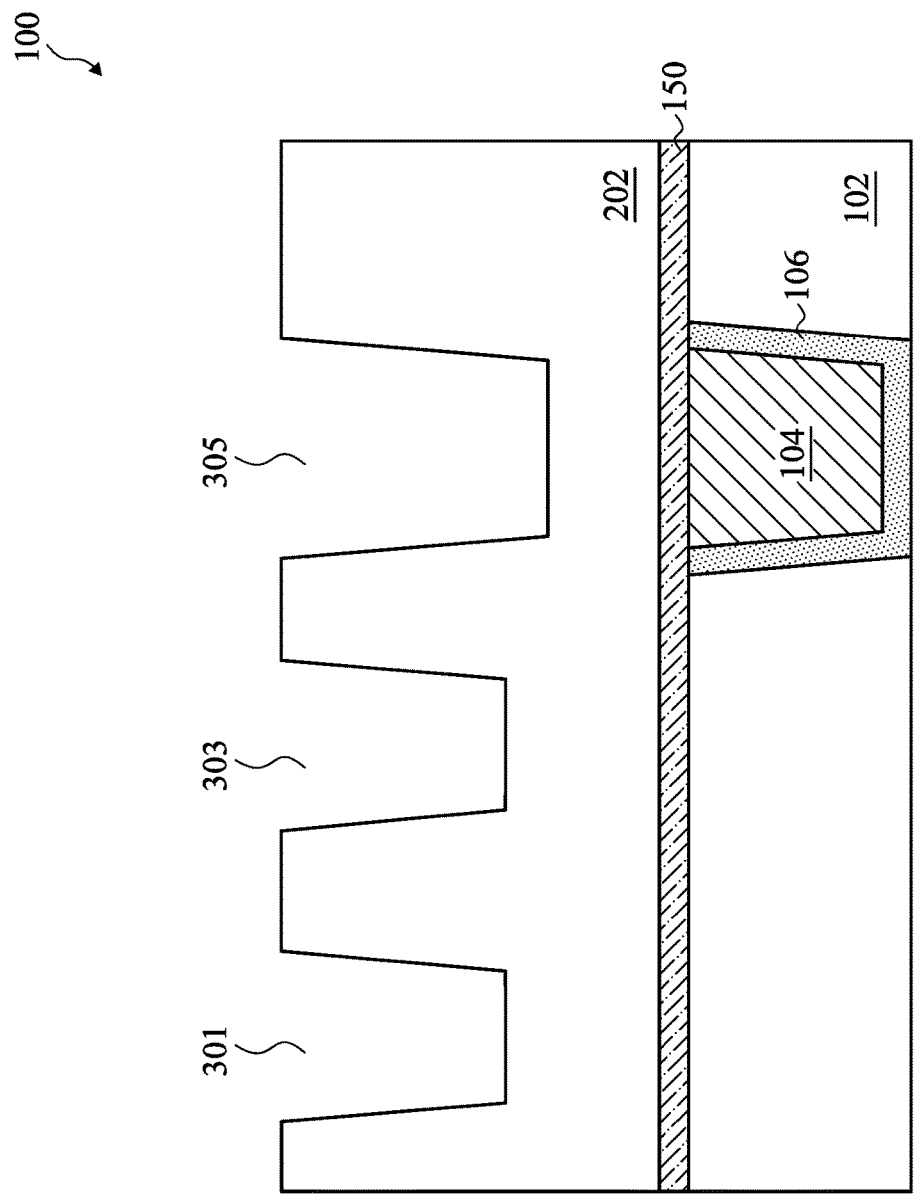
FIG. 3 illustrates a cross sectional view of the semiconductor device shown in FIG. 2 after three trenches have been formed in the first dielectric layer in accordance with various embodiments of the present disclosure.

FIG. 3 illustrates a cross sectional view of the semiconductor device shown in FIG. 2 after three trenches have been formed in the first dielectric layer in accordance with various embodiments of the present disclosure. According to the location of the metal lines 205, 214 and 224 shown in FIG. 1, trenches 301, 303 and 305 are formed in the second dielectric layer 202. The trenches 301, 303 and 305 may be formed by any suitable semiconductor patterning techniques such as an etching process, a laser ablation process and/or the like. For example, the trenches 301, 303 and 305 may be formed by using photolithography techniques to deposit and pattern a photoresist material (not shown) on the second dielectric layer 202. Portions of the photoresist are exposed according to the location and shape of the metal lines 205, 214 and 224 shown in FIG. 1. An etching process, such as an anisotropic dry etch process and/or the like, may be used to form the trenches 301, 303 and 305 in the second dielectric layer 202.

It should be noted that, in some embodiments, the width of the first trench 301 is approximately equal to the width of the second trench 303. The width of the third trench 305 may be greater than the width of the first trench 301 as shown in FIG. 3. Furthermore, in some embodiments, the bottom of the first trench 301 is level with the bottom of the trench 303. The bottom of the third trench 305 is lower than the bottom of the first trench 301 as shown in FIG. 3.

Figure 4:
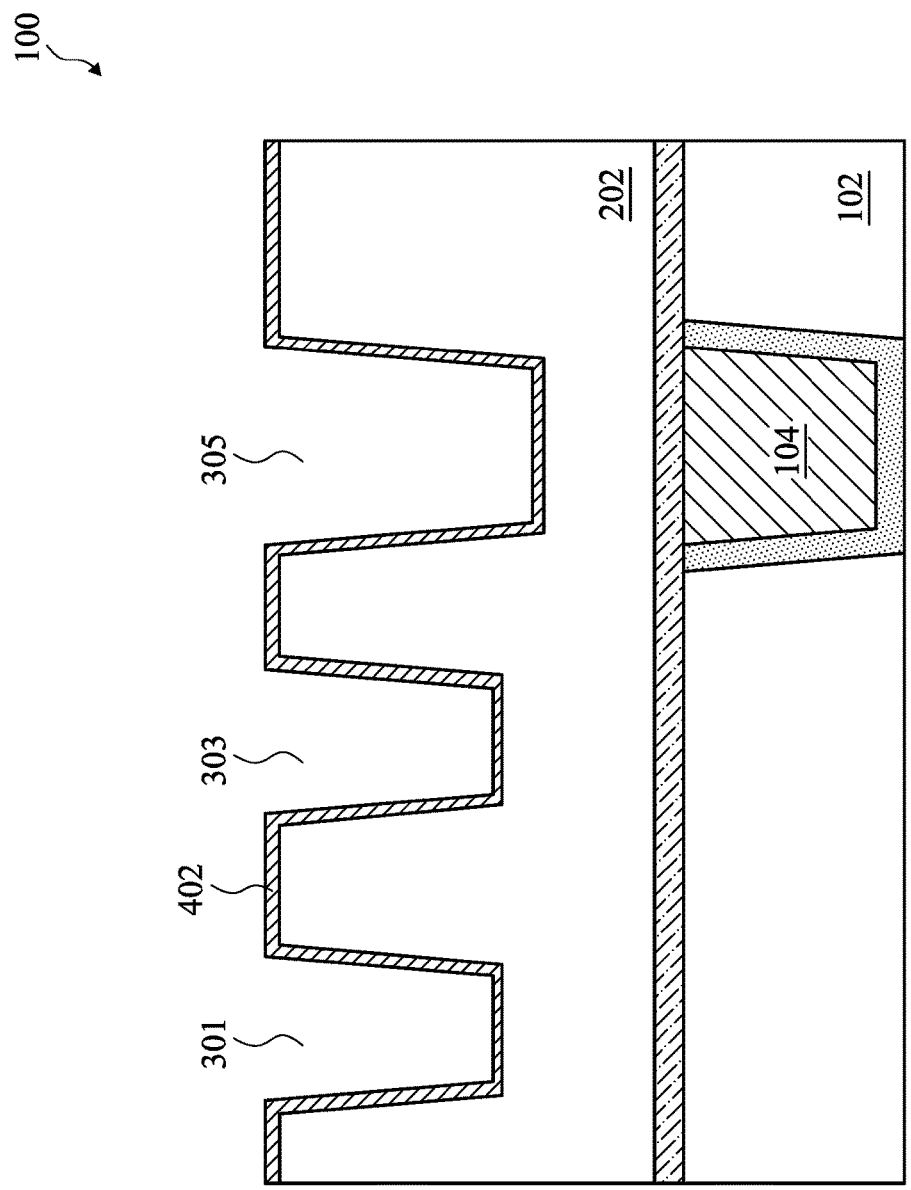
FIG. 4 illustrates a cross sectional view of the semiconductor device shown in FIG. 3 after a protection layer is formed over the semiconductor device in accordance with various embodiments of the present disclosure.

FIG. 4 illustrates a cross sectional view of the semiconductor device shown in FIG. 3 after a protection layer is formed over the semiconductor device in accordance with various embodiments of the present disclosure. The protection layer 402 may be formed over the top surface of the semiconductor device 100 as shown in FIG. 4. The protection layer 402 may be a dielectric material such as silicon nitride, silicon carbide, silicon oxide, silicon boride, silicon fluoride, combinations thereof, and multi-layers thereof.

Alternatively, the protection layer 402 may be a metal material such as metal oxide, metal nitride, combinations thereof, and multi-layers thereof. The metal of the protection layer 402 may be Al, Mn, Co, Ti, Ta, W, Ni, Sn, Mg and/or the like. In some embodiments, the protection layer 402 comprises $M_XO_YN_Z$ (M represents metal; O represents oxide; N represents nitride). In some embodiments, X is in a range from about 20% to about 70%. Y is in a range from about 0% to about 80%. Z is in a range from about 0% to about 80%.

In some embodiments, the protection layer 402 may be formed using a suitable deposition process such as chemical vapor deposition (CVD) such as Aerosol assisted CVD (AACVD), Direct liquid injection CVD (DLICVD), Microwave plasma-assisted CVD (MPCVD), Plasma-Enhanced CVD (PECVD), Remote plasma-enhanced CVD (RPECVD), Atomic-layer CVD (ALCVD), Combustion CVD (CCVD), Hot filament CVD (HFCVD), Hybrid Physical-Chemical Vapor Deposition (HPCVD), Metalorganic CVD (MOCVD), Rapid thermal CVD (RTCVD), Vapor-phase epitaxy (VPE), Photo-initiated CVD (PICVD) and/or the like. The protection layer 402 may be of a thickness in a range from about 5 Angstroms to about 50 Angstroms.

Figure 5:
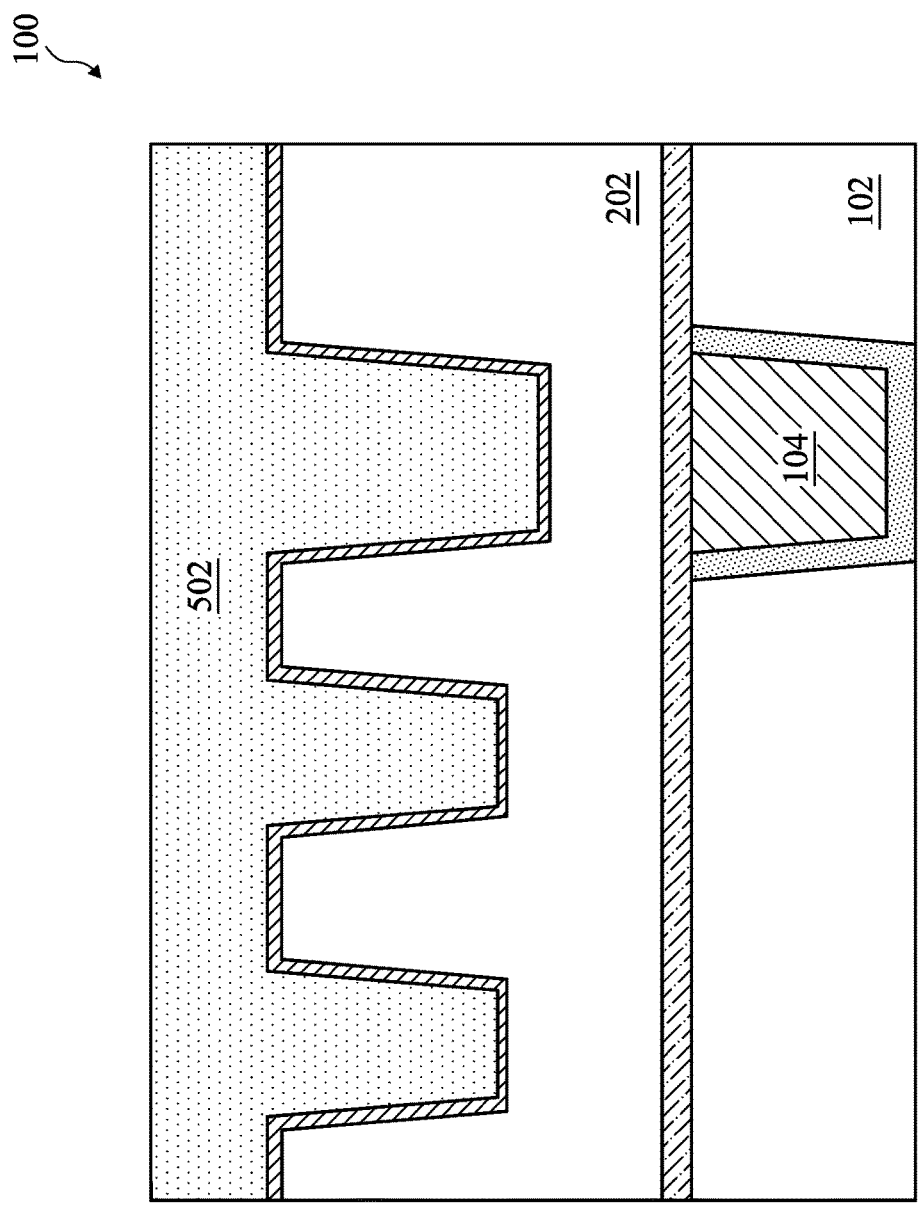
FIG. 5 illustrates a cross sectional view of the semiconductor device shown in FIG. 4 after a photoresist layer is formed over the semiconductor device in accordance with various embodiments of the present disclosure.

FIG. 5 illustrates a cross sectional view of the semiconductor device shown in FIG. 4 after a photoresist layer is formed over the semiconductor device in accordance with various embodiments of the present disclosure. The photoresist layer 502 is deposited over the semiconductor device 100. More particularly, the photoresist material fills the trenches 301, 303 and 305 as shown in FIG. 5.

Figure 6:
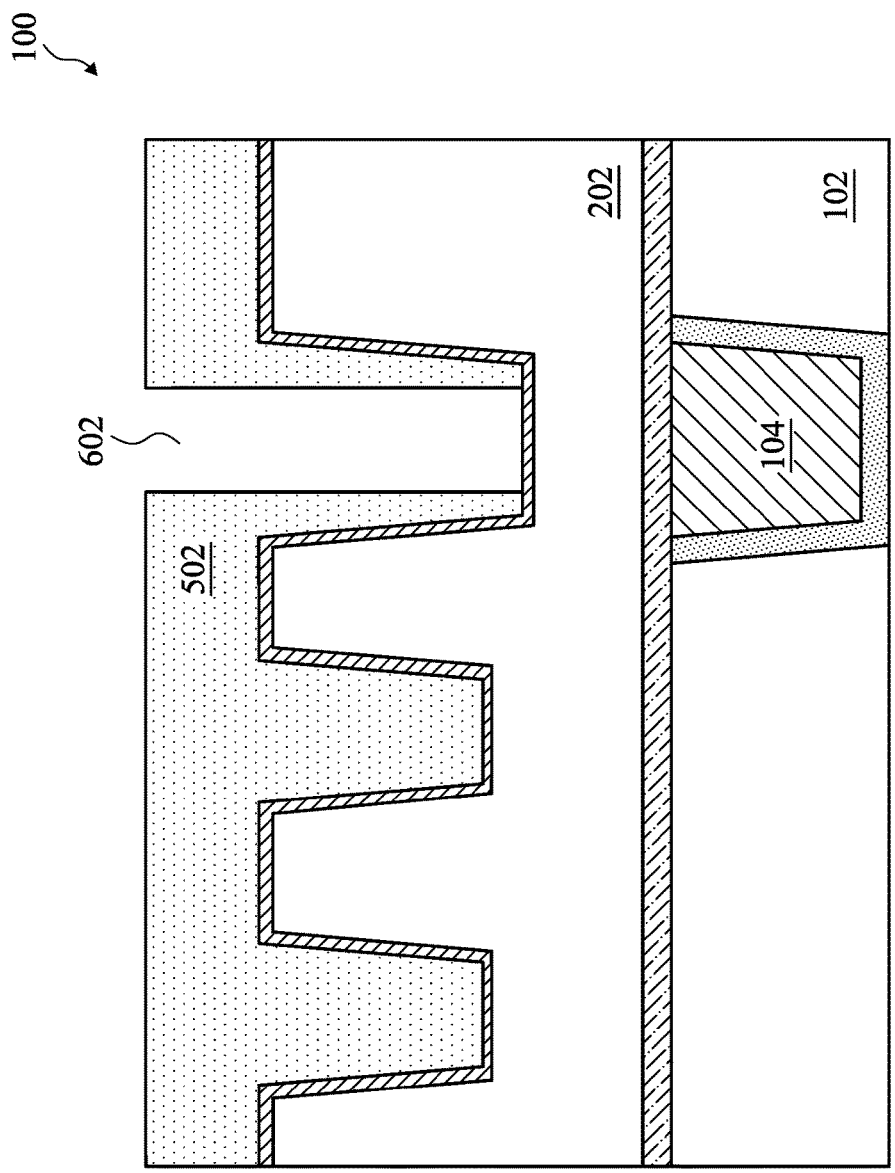
FIG. 6 illustrates a cross sectional view of the semiconductor device shown in FIG. 5 after a patterning process is applied to the photoresist layer in accordance with various embodiments of the present disclosure.

FIG. 6 illustrates a cross sectional view of the semiconductor device shown in FIG. 5 after a patterning process is applied to the photoresist layer in accordance with various embodiments of the present disclosure. The photoresist layer 502 is patterned according to the shape of the via 203 (not illustrated but shown in FIG. 1). More particularly, the photoresist layer 502 may be exposed and developed as part of a suitable photolithography process. After the photolithography process finishes, an opening 602 is formed in the photoresist layer 502 as shown in FIG. 6.

Figure 7:
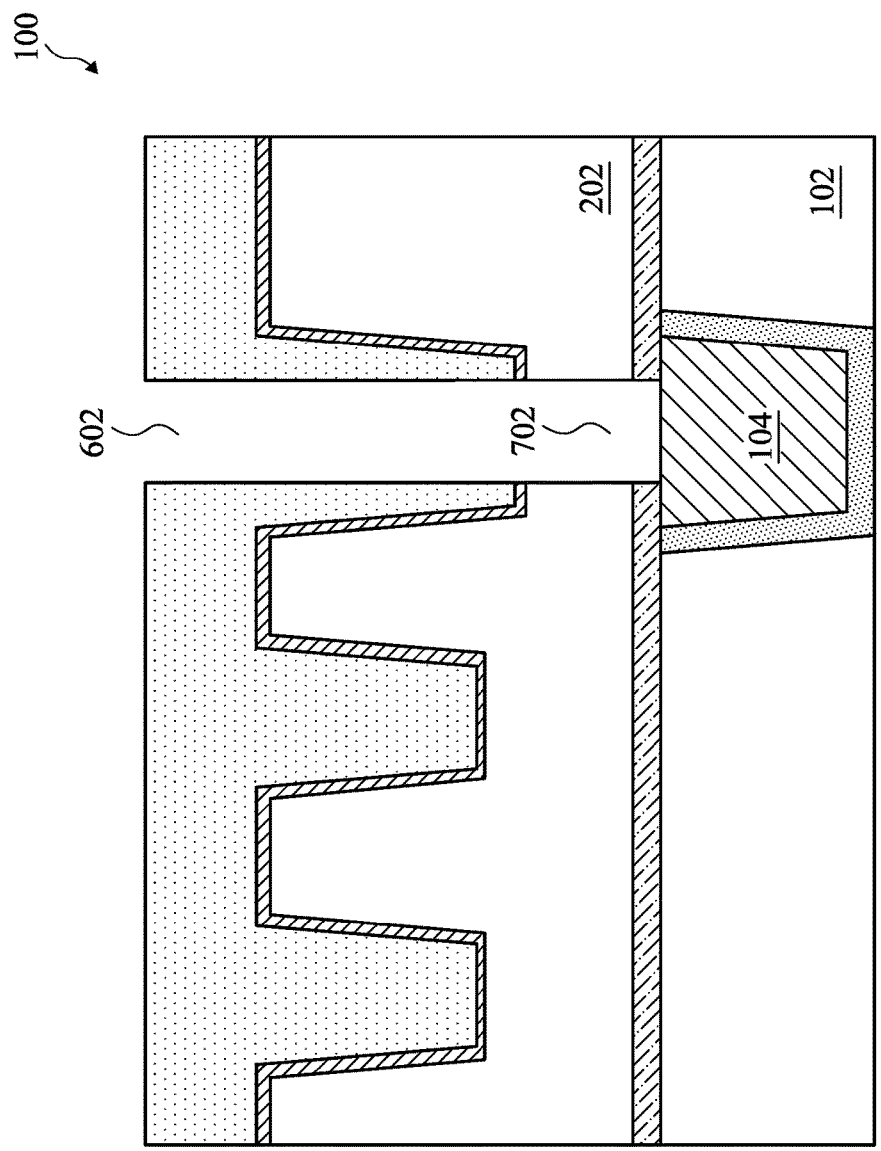
FIG. 7 illustrates a cross sectional view of the semiconductor device shown in FIG. 6 after a via trench is formed in the first dielectric layer in accordance with various embodiments of the present disclosure.

FIG. 7 illustrates a cross sectional view of the semiconductor device shown in FIG. 6 after a via trench is formed in the first dielectric layer in accordance with various embodiments of the present disclosure. The via trench 702 may be formed by any suitable semiconductor patterning techniques such as an etching process and/or the like. In some embodiments, the exposed portion (shown in FIG. 6) of the second dielectric layer 202 will be removed to form the via trench 702.

Figure 8:
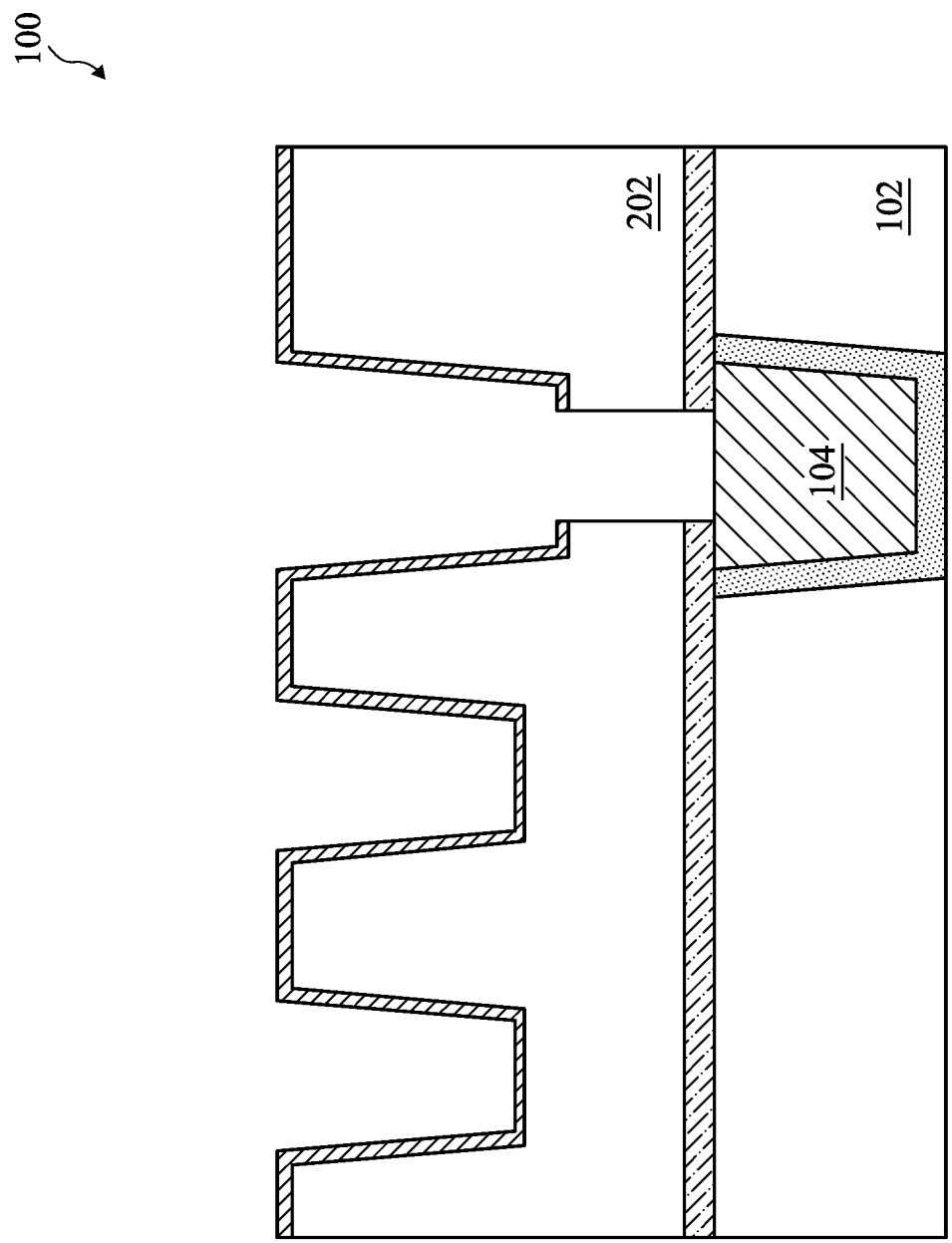
FIG. 8 illustrates a cross sectional view of the semiconductor device shown in FIG. 7 after the remaining photoresist layer has been removed in accordance with various embodiments of the present disclosure.

FIG. 8 illustrates a cross sectional view of the semiconductor device shown in FIG. 7 after the remaining photoresist layer has been removed in accordance with various embodiments of the present disclosure. The remaining photoresist layer shown in FIG. 7 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 9:
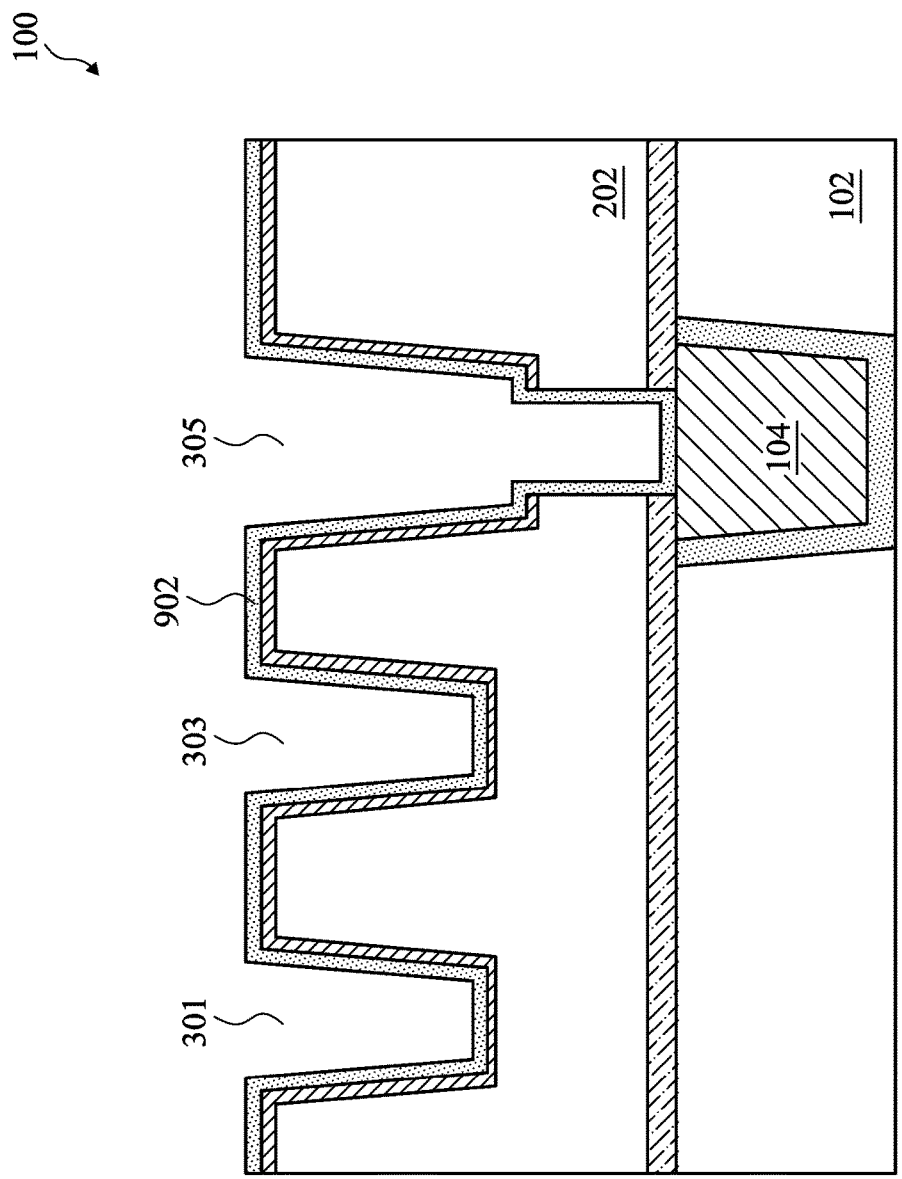
FIG. 9 illustrates a cross sectional view of the semiconductor device shown in FIG. 8 after a barrier layer is formed over the sidewalls and bottom of the trenches in accordance with various embodiments of the present disclosure.

FIG. 9 illustrates a cross sectional view of the semiconductor device shown in FIG. 8 after a barrier layer is formed over the sidewalls and bottom of the trenches in accordance with various embodiments of the present disclosure. The barrier layer 902 is formed conformally along the sidewalls and bottom of the trenches 301, 303, 305 and 702.

The barrier layer 902 may be formed of suitable metal materials such as tantalum, tantalum nitride, manganese, manganese oxide, any combinations thereof and/or the like. The barrier layer 902 may be formed using suitable fabrication techniques such as CVD and/or the like. In some embodiments, the barrier layer 902 may be of a thickness in a range from about 0.4 µm to about 1 µm.

Furthermore, a seed layer (not shown) may be formed over the barrier layer 902 in accordance with various embodiments. The seed layer may be may be formed of copper, nickel, gold, any combination thereof and/or the like. The seed layer may be formed by suitable deposition techniques such as PVD, CVD and/or the like. The seed layer may have a thickness in a range from about 50 Angstroms to about 1,000 Angstroms.

In addition, the seed layer may be alloyed with a material that improves the adhesive properties of the seed layer so that it can act as an adhesion layer. For example, the seed layer may be alloyed with a suitable material such as manganese, aluminum, any combinations thereof and/or the like, which will migrate to the interface between the seed layer and the barrier layer and will enhance the adhesion between these two layers. The alloying material may be introduced during formation of the seed layer. The alloying material may comprise no more than about 10% of the seed layer.

Figure 10:
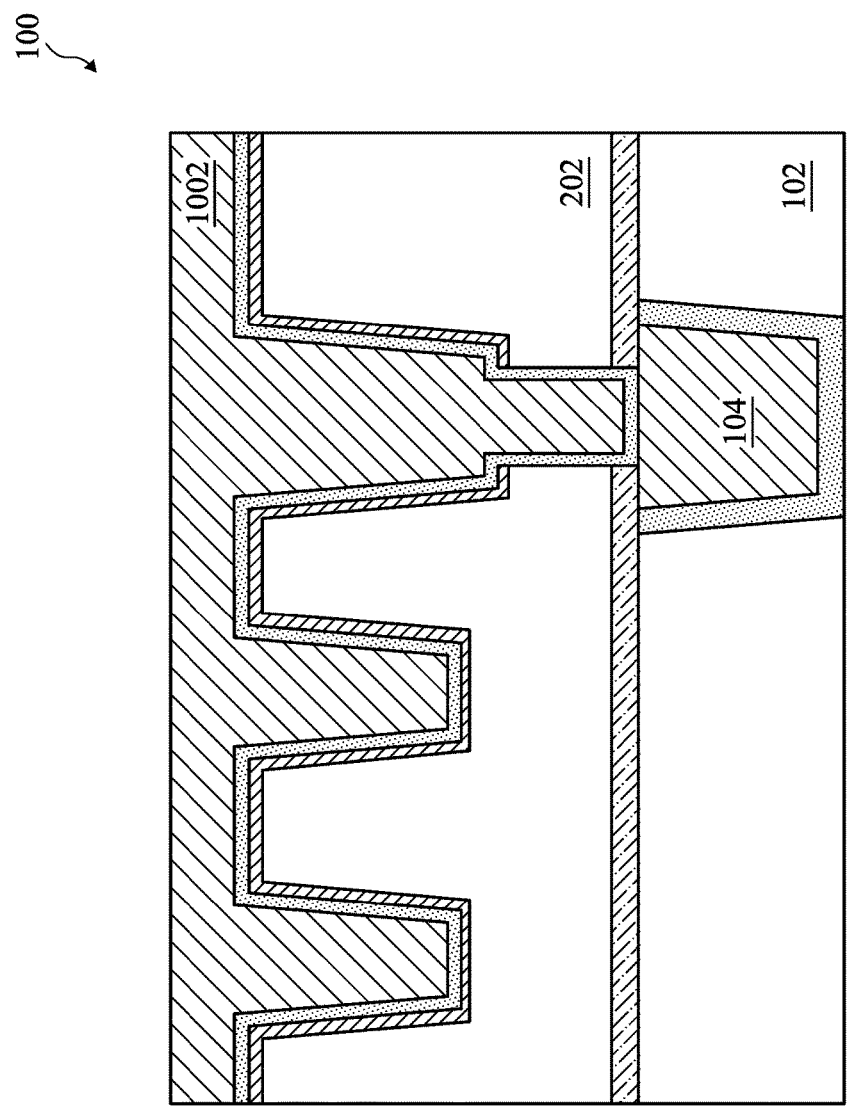
FIG. 10 illustrates a cross sectional view of the semiconductor device shown in FIG. 9 after a conductive material is filled in the trenches in accordance with various embodiments of the present disclosure.

FIG. 10 illustrates a cross sectional view of the semiconductor device shown in FIG. 9 after a conductive material is filled in the trenches in accordance with various embodiments of the present disclosure. As shown in FIG. 10, the conductive material 1002 may be filled in the trenches 301, 303 and 305 (shown in FIG. 9). The conductive material 1002 may be copper, but can be any suitable conductive materials, such as copper alloys, aluminum, tungsten, silver, any combinations thereof and/or the like. The conductive material 1002 may be formed by suitable techniques such as electroplating, an electro-less plating process, CVD and/or the like.

Figure 11:
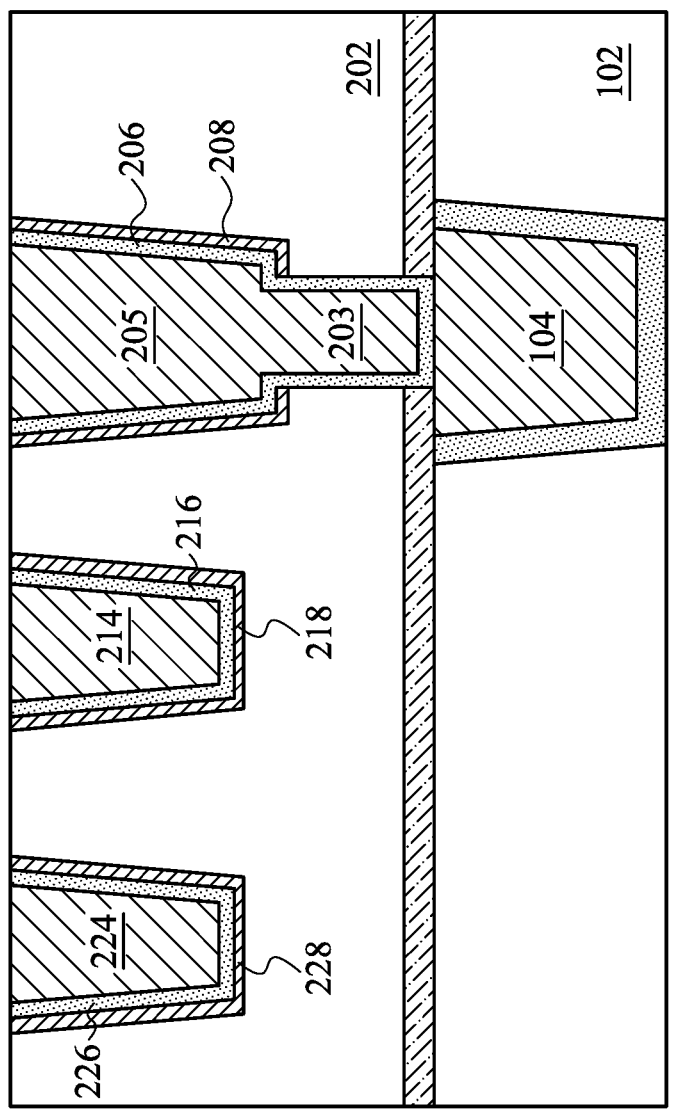
FIG. 11 illustrates a cross sectional view of the semiconductor device shown in FIG. 10 after a planarization process is performed to remove excess conductive materials in accordance with various embodiments of the present disclosure.

FIG. 11 illustrates a cross sectional view of the semiconductor device shown in FIG. 10 after a planarization process is performed to remove excess conductive materials in accordance with various embodiments of the present disclosure. The planarization process may be implemented by using suitable techniques such as grinding, polishing and/or chemical etching, a combination of etching and grinding techniques.

In accordance with various embodiments, the planarization process may be implemented by using a chemical mechanical polish (CMP) process. In the CMP process, a combination of etching materials and abrading materials are put into contact with the top surface of the semiconductor device and a grinding pad (not shown) is used to grind away excess copper and portions of the barrier layer and the protection layer until the top surface of the second dielectric layer 202 is exposed.

Figure 12:
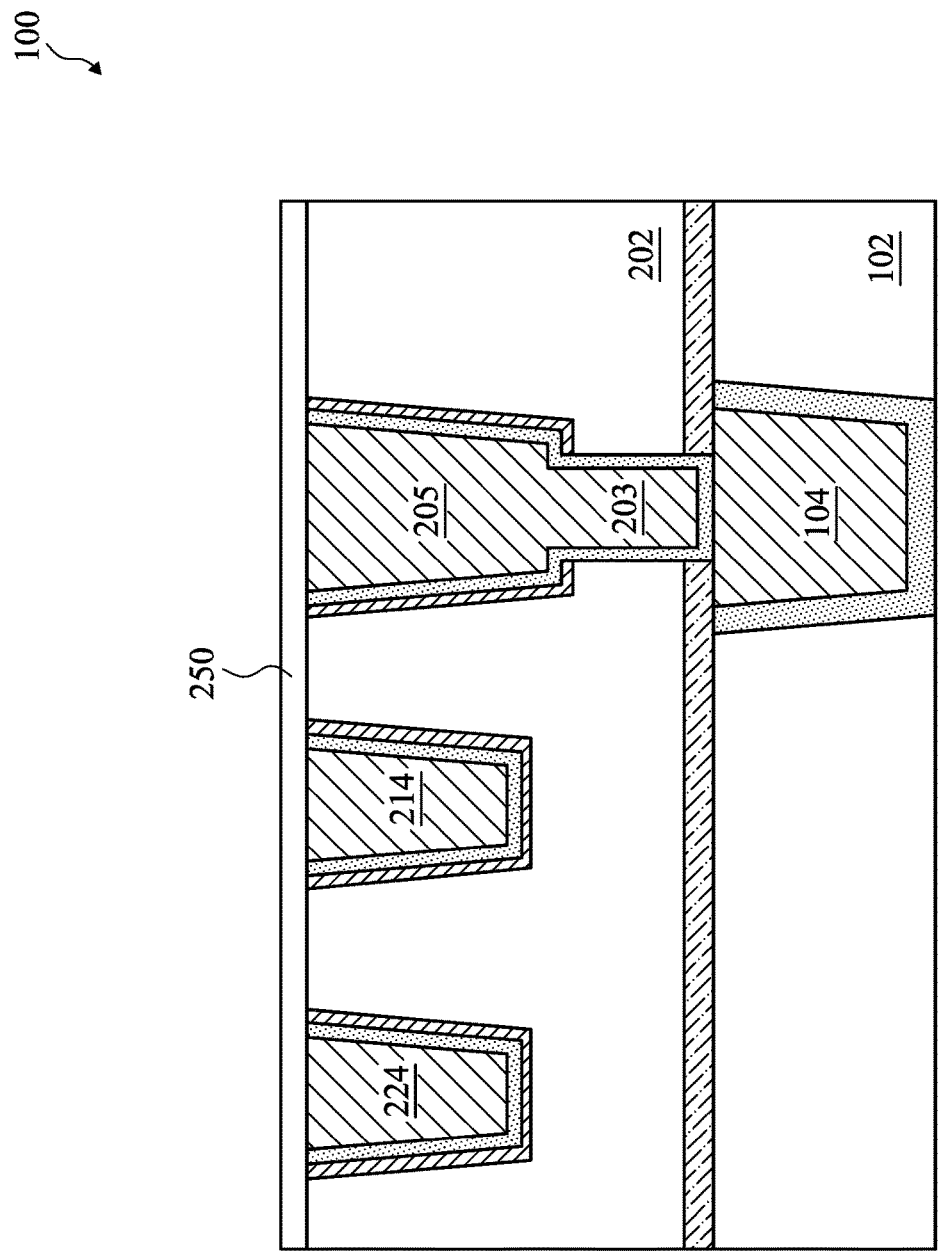
FIG. 12 illustrates a cross sectional view of the semiconductor device shown in FIG. 11 after a hard mask layer is formed over the second dielectric layer in accordance with various embodiments.

FIG. 12 illustrates a cross sectional view of the semiconductor device shown in FIG. 11 after a hard mask layer is formed over the second dielectric layer in accordance with various embodiments. In some embodiments, the hard mask layer 250 may be may be a dielectric material such as silicon nitride, silicon carbide, silicon oxide, silicon boride, silicon fluoride, combinations thereof, and multi-layers thereof.

Alternatively, the hard mask layer 250 may be a metal material such as metal oxide, metal nitride, combinations thereof, and multi-layers thereof. The metal of the hard mask layer 250 may be Al, Mn, Co, Ti, Ta, W, Ni, Sn, Mg and/or the like. In some embodiments, the hard mask layer 250 comprises $M_XO_YN_Z$ (M represents metal; O represents oxide; N represents nitride). In some embodiments, X is in a range from about 20% to about 70%. Y is in a range from about 0% to about 80%. Z is in a range from about 0% to about 80%.

In some embodiments, the hard mask layer 250 may be formed using a suitable deposition process such as chemical vapor deposition (CVD) such as Aerosol assisted CVD (AACVD), Direct liquid injection CVD (DLICVD), Microwave plasma-assisted CVD (MPCVD), Plasma-Enhanced CVD (PECVD), Remote plasma-enhanced CVD (RPECVD), Atomic-layer CVD (ALCVD), Combustion CVD (CCVD), Hot filament CVD (HFCVD), Hybrid Physical-Chemical Vapor Deposition (HPCVD), Metalorganic CVD (MOCVD), Rapid thermal CVD (RTCVD), Vapor-phase epitaxy (VPE), Photo-initiated CVD (PICVD) and/or the like. The hard mask layer 250 may be of a thickness in a range from about 5 Angstroms to about 50 Angstroms.

It should be noted while FIG. 12 illustrates a single hard mask layer 250, one of ordinary skill in the art would recognize many variations, alternatives, and modifications. For example, a multi-layer hard mask may also be used.

Figure 13:
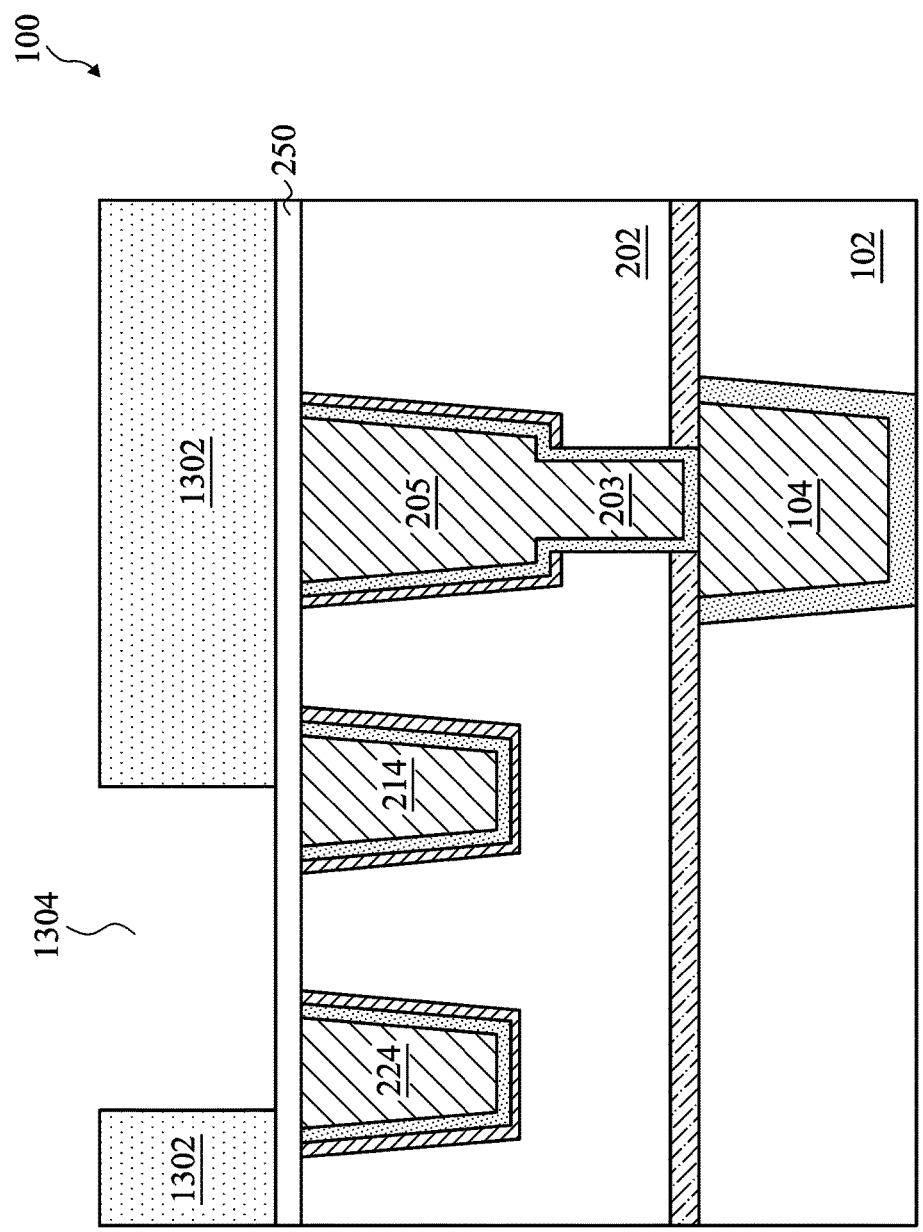
FIG. 13 illustrates a cross sectional view of the semiconductor device shown in FIG. 12 after a photoresist layer is formed over the hard mask layer in accordance with various embodiments of the present disclosure.

FIG. 13 illustrates a cross sectional view of the semiconductor device shown in FIG. 12 after a photoresist layer is formed over the hard mask layer in accordance with various embodiments of the present disclosure. The photoresist layer 1302 is deposited over the hard mask layer 250. The photoresist layer 1302 is patterned according to the location of the air gap 215 (shown in FIG. 1). More particularly, the photoresist layer 1302 may be exposed and developed as part of a suitable photolithography process. After the photolithography process finishes, an opening 1304 is formed in the photoresist layer 1302 as shown in FIG. 13.

Figure 14:
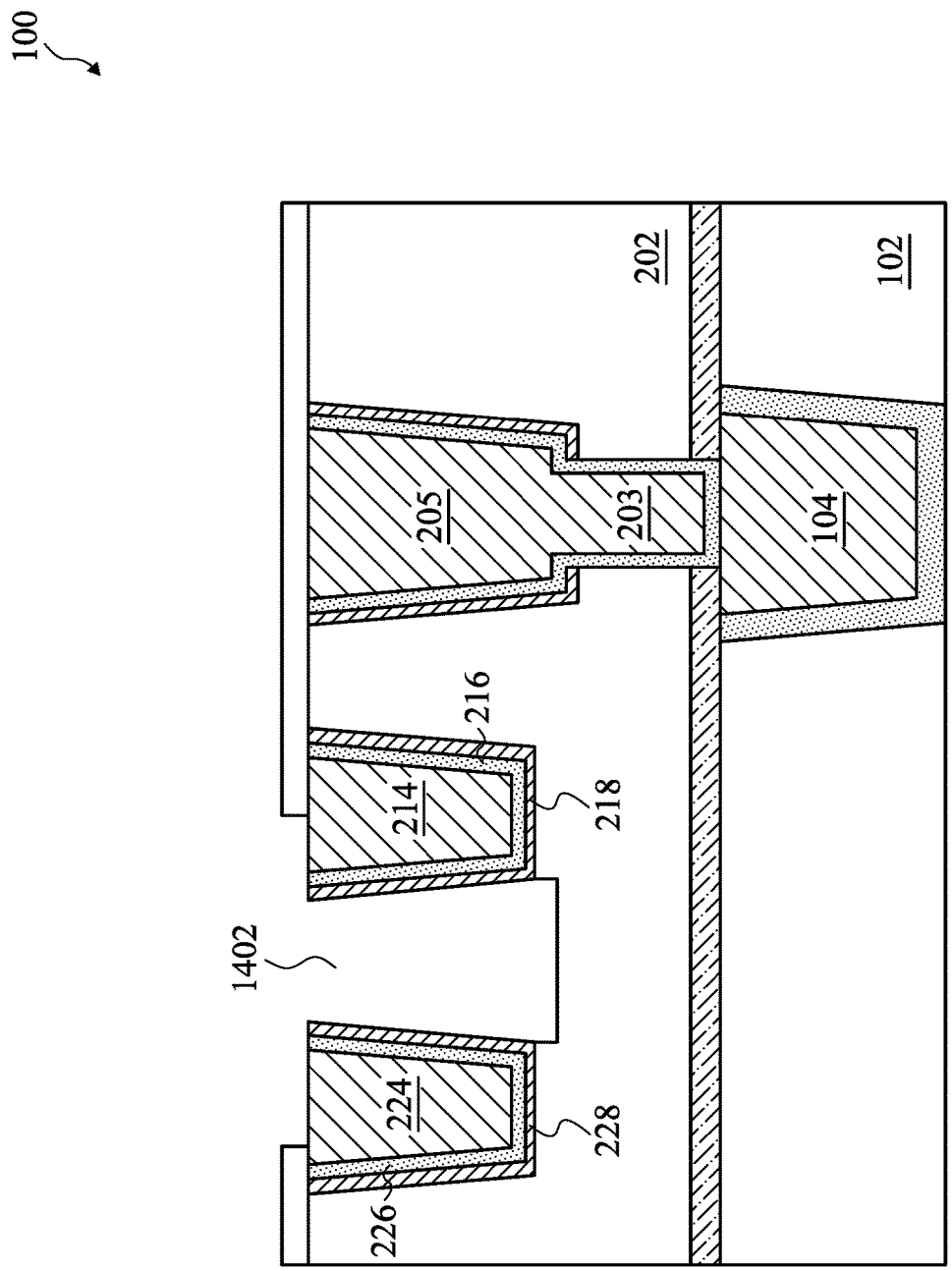
FIG. 14 illustrates a cross sectional view of the semiconductor device shown in FIG. 13 after an air gap trench has been formed in the first dielectric layer in accordance with various embodiments of the present disclosure.

FIG. 14 illustrates a cross sectional view of the semiconductor device shown in FIG. 13 after an air gap trench has been formed in the first dielectric layer in accordance with various embodiments of the present disclosure. According to the location of the air gap 215 shown in FIG. 1, an opening 1402 is formed in the second dielectric layer 202. The opening 1402 is partially through the second dielectric layer 202. In some embodiments, the bottom of the opening 1402 is lower than the bottoms of metal lines 214 and 224.

The opening 1402 may be formed by any suitable semiconductor patterning techniques such as an etching process, a laser ablation process and/or the like. For example, an etching process, such as an anisotropic dry etch process, may be used to form the opening 1402 partially through the second dielectric layer 202.

One advantageous feature of having the protection layers 218 and 228 is the barrier layers 216 and 226 are protected during the etching process. Without the protection layers 218 and 228, portions of the barrier layers 216 and 226 may be damaged when the etching process is applied to the second dielectric layer 202. The damaged barrier layers 216 and 226 may not prevent the metal of the metal lines 214 and 224 from diffusing into the second dielectric layer 202.

Figure 15:
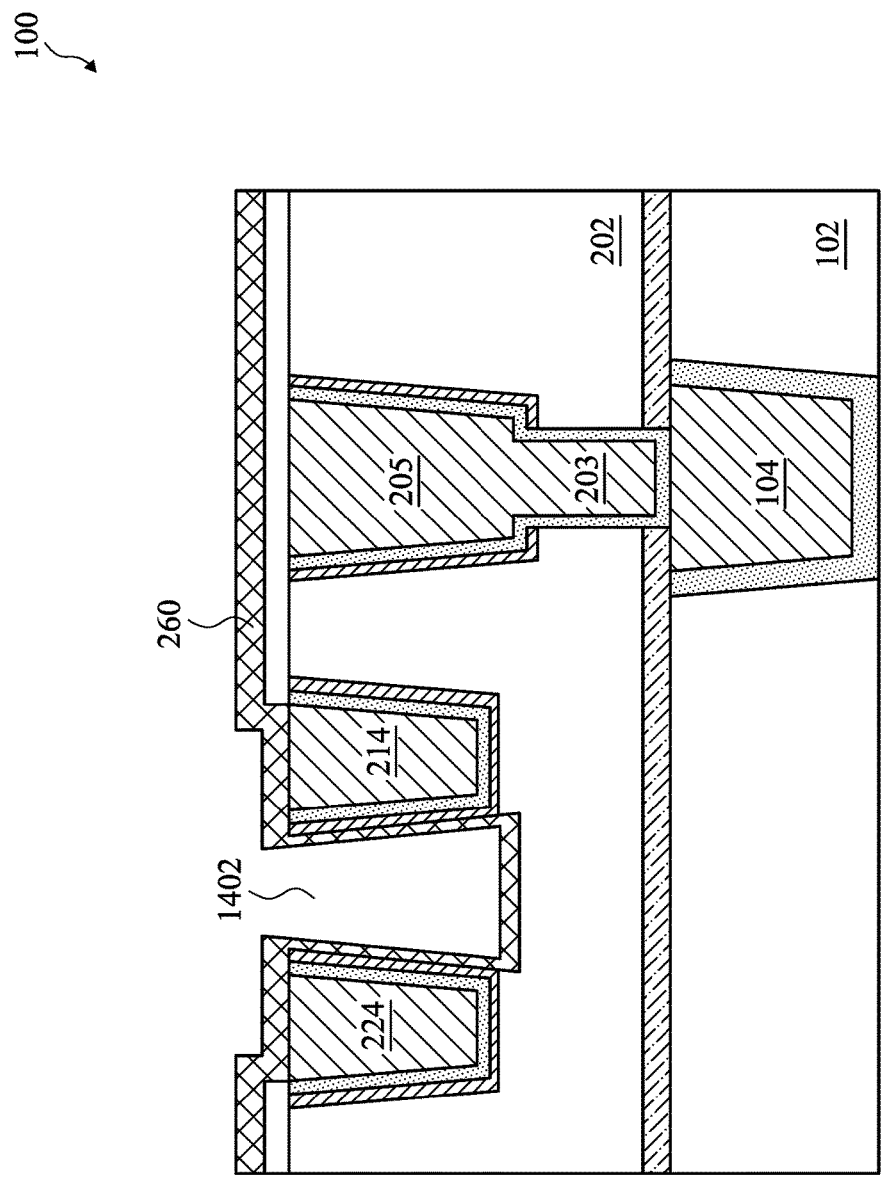
FIG. 15 illustrates a cross sectional view of the semiconductor device shown in FIG. 14 after a liner layer is formed in the air gap trench in accordance with various embodiments of the present disclosure.

FIG. 15 illustrates a cross sectional view of the semiconductor device shown in FIG. 14 after a liner layer is formed in the air gap trench in accordance with various embodiments of the present disclosure. The liner layer 260 may be formed over the semiconductor device 100. More particularly, the sidewalls and the bottom of the air gap trench 1402 may be deposited with the liner layer 260.

The liner layer 260 may be a dielectric material such as silicon nitride, silicon carbide, silicon oxide, silicon boride, silicon fluoride, combinations thereof, and multi-layers thereof. Alternatively, the liner layer 260 may be a metal material such as metal oxide, metal nitride, combinations thereof, and multi-layers thereof. The metal of the liner layer 260 may be Al, Mn, Co, Ti, Ta, W, Ni, Sn, Mg and/or the like. In some embodiments, the liner layer 260 comprises $M_XO_YN_Z$ (M represents metal; O represents oxide; N represents nitride). In some embodiments, X is in a range from about 20% to about 70%. Y is in a range from about 0% to about 80%. Z is in a range from about 0% to about 80%.

In some embodiments, the liner layer 260 may be formed using a suitable deposition process such as chemical vapor deposition (CVD) such as Aerosol assisted CVD (AACVD), Direct liquid injection CVD (DLICVD), Microwave plasma-assisted CVD (MPCVD), Plasma-Enhanced CVD (PECVD), Remote plasma-enhanced CVD (RPECVD), Atomic-layer CVD (ALCVD), Combustion CVD (CCVD), Hot filament CVD (HFCVD), Hybrid Physical-Chemical Vapor Deposition (HPCVD), Metalorganic CVD (MOCVD), Rapid thermal CVD (RTCVD), Vapor-phase epitaxy (VPE), Photo-initiated CVD (PICVD) and/or the like. The liner layer 260 may be of a thickness in a range from about 5 Angstroms to about 50 Angstroms.

Figure 16:
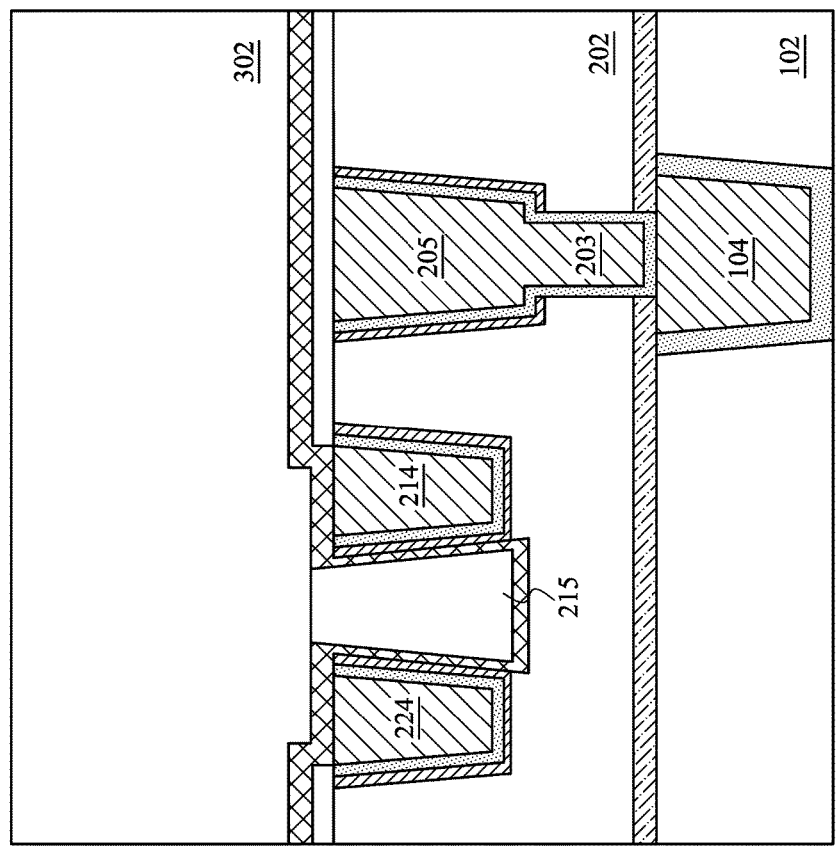
FIG. 16 illustrates a cross sectional view of the semiconductor device shown in FIG. 15 after the third dielectric layer is formed over the second dielectric layer and an air gap is formed in accordance with various embodiments of the present disclosure.

FIG. 16 illustrates a cross sectional view of the semiconductor device shown in FIG. 15 after the third dielectric layer is formed over the second dielectric layer and an air gap is formed in accordance with various embodiments of the present disclosure. A dielectric material 302 may be deposited over the semiconductor device 100 through suitable deposition techniques such as a conformal deposition technique.

As shown in FIG. 16, after the dielectric layer 302 is deposited over the semiconductor device 100, one air gap 215 may be formed due to the higher aspect ratio (i.e., the ratio between the gap height and gap width) of the openings between two adjacent metal lines 214 and 224. As shown in FIG. 16, the narrow gap width may result in an overhang formed in the upper portion of the gap. Such an overhang may prevent the dielectric material 302 from filling the opening so that the air gap 215 is formed as shown in FIG. 16.

As shown in FIG. 16, the air gap 215 is of a trapezoidal shape. It should further be noted that the shape shown in FIG. 16 is selected purely for demonstration purposes and are not intended to limit the various embodiments of the present disclosure. For example, it is within the scope and spirit of the present disclosure for the air gap 215 to comprise other shapes, such as, but no limited to rectangle, oval, square, triangle and/or the like.

One advantageous feature having the air gap 215 shown in FIG. 16 is that the air in the air gap 215 exhibits a permittivity approximately equal to 1. Such a low permittivity helps to reduce the capacitive coupling between adjacent metal lines (e.g., metal lines 214 and 224). Such reduced capacitive coupling may help to improve reliability characteristics.

Figure 17:
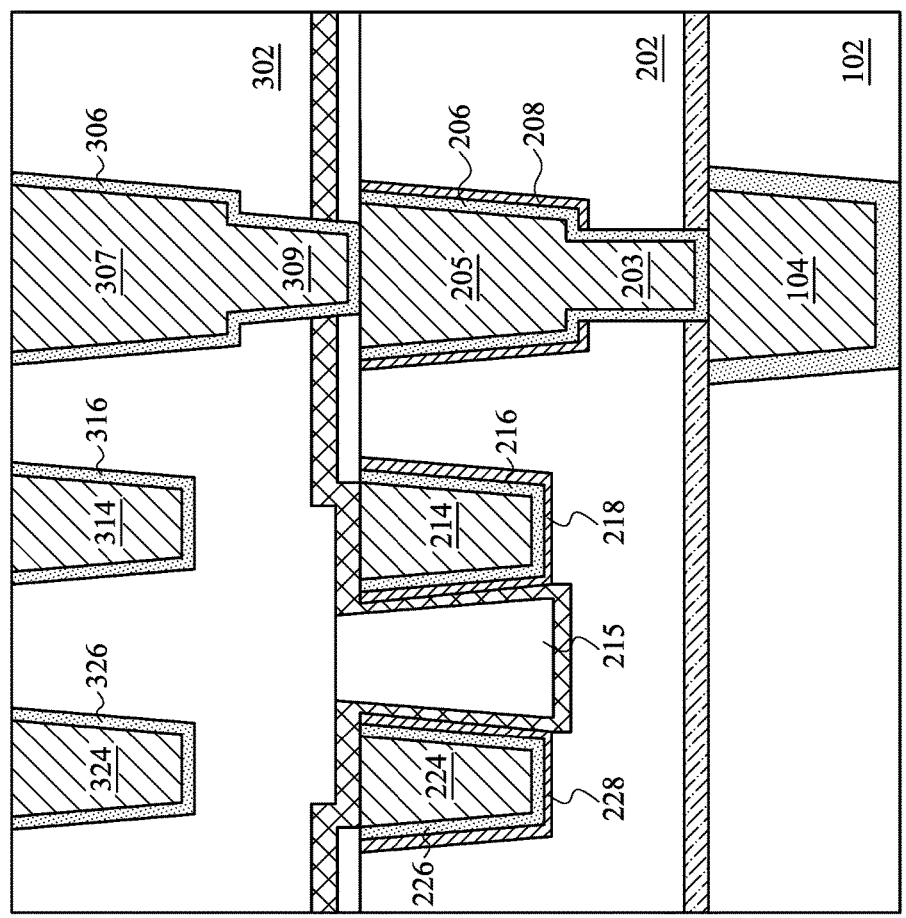
FIG. 17 illustrates a cross sectional view of the semiconductor device shown in FIG. 16 after three metal lines have been formed in the third dielectric layer in accordance with various embodiments of the present disclosure.

FIG. 17 illustrates a cross sectional view of the semiconductor device shown in FIG. 16 after three metal lines have been formed in the third dielectric layer in accordance with various embodiments of the present disclosure. According to the location and shape of the metal lines 304, 314 and 324, openings (not shown) are formed in the third dielectric layer 302. The openings may be formed by a dual damascene process, although other suitable techniques such as single damascene may alternatively be used. The dual damascene process is well known in the art, and hence is not discussed herein.

Barrier layers 306, 316 and 326 may be deposited on the sidewalls as well as the bottoms of their respective openings. The barrier layers 306, 316 and 326 may be formed of titanium, titanium nitride, tantalum, tantalum nitride, and combinations thereof and/or the like. The barrier layers 306, 316 and 326 may be formed using suitable fabrication techniques such as ALD, PECVD and/or the like.

A conductive material is then filled in the openings. The conductive material may be copper, but can be any suitable conductive materials, such as copper alloys, aluminum, tungsten, titanium, silver, any combinations thereof and/or the like. The conductive material may be formed by suitable fabrication techniques such as an electro-less plating process, CVD, electroplating and/or the like.

A planarization process is performed to remove excess conductive materials to form the metal lines 304, 314 and 324 as shown in FIG. 17. The planarization process may be implemented by using suitable techniques such as grinding, polishing and/or chemical etching, a combination of etching and grinding techniques.

Figure 18:
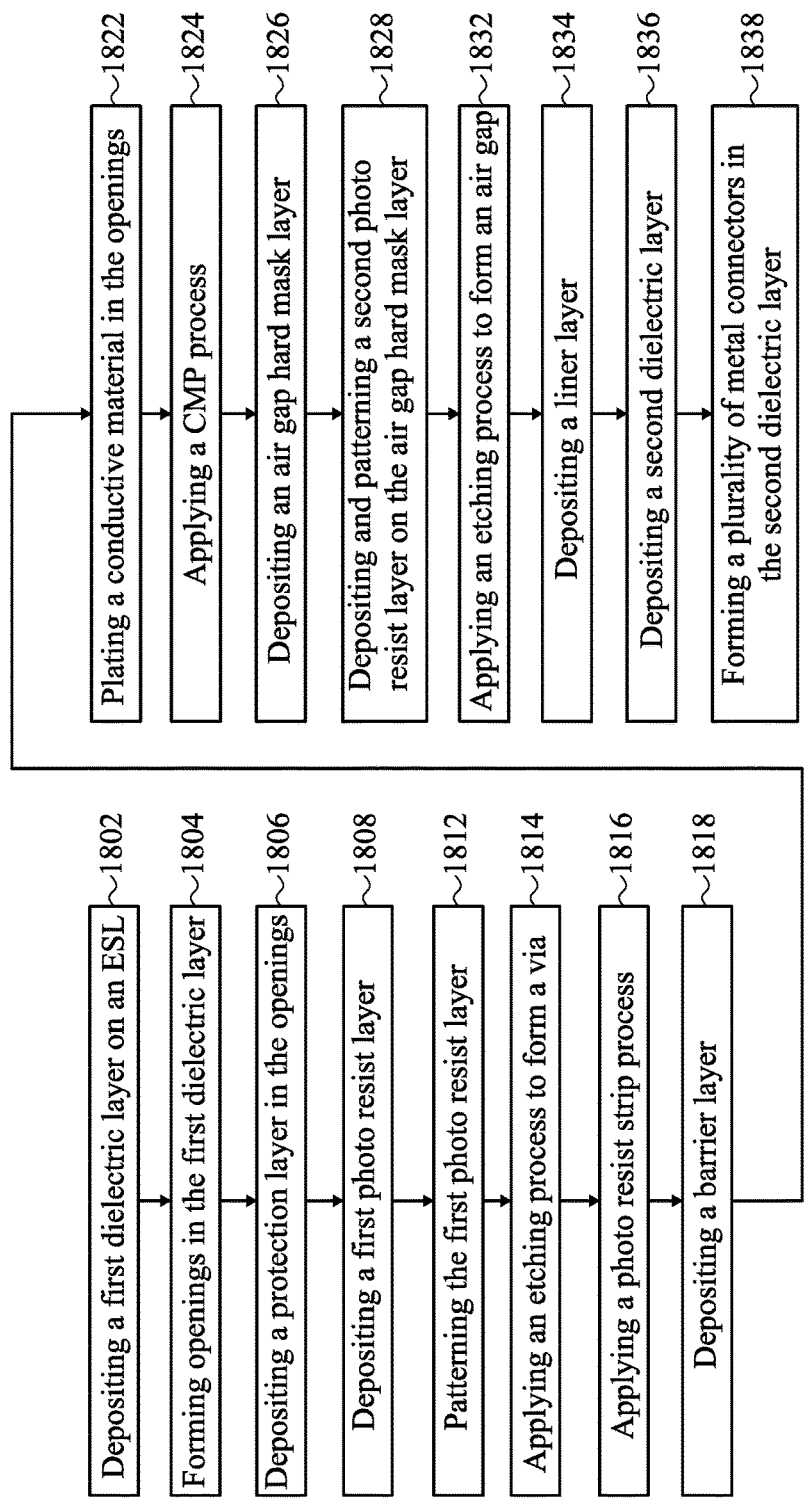
FIG. 18 illustrates a flow chart of a method for forming the semiconductor device shown in FIG. 1 in accordance with various embodiments of the present disclosure.

FIG. 18 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 18 may added, removed, replaced, rearranged and repeated.

At step 1802, a second dielectric layer is deposited on an etching stop layer. The etching stop layer is over a first dielectric layer. At step 1804, three openings are formed in the second dielectric layer. In some embodiments, the bottom of the first opening is level with the bottom of the second opening. The bottom of the third opening is lower than the bottom of the first opening.

At step 1806, a protection layer is deposited. The protection layer is on the sidewalls and bottom of the three openings. At step 1808, a first photoresist layer is deposited over the protection layer. More particularly, the photoresist material fills the three openings. At step 1812, a patterning process is applied to the first photoresist layer. As a result, a portion of the second dielectric layer under the third trench is exposed.

At step 1814, an etching process is applied to the exposed dielectric layer. A via trench is formed after the etching process finishes. At step 1816, the remaining photoresist layer is removed through a suitable photoresist stripping process. At step 1818, a barrier layer is deposited. The barrier layer is formed on the sidewalls and bottom of the trenches.

At step 1822, a conductive material is filled in the openings to form a plurality of metal lines. At step 1824, a chemical mechanical polish process is applied to the conductive material over the top surface of the dielectric layer. At step 1826, an air gap hard mask layer is formed over the dielectric layer. At step 1828, a second photoresist layer is deposited over the air gap hard mask layer. A patterning process is applied to the second photoresist layer. At step 1832, a suitable etching process is employed to form an opening between the first metal line and the second metal line.

At step 1834, a liner layer is deposited on sidewalls and a bottom of the opening formed in step 1832. At step 1836, a third dielectric layer is deposited over the metal lines. An air gap is formed between two adjacent metal lines. At step 1838, a plurality of openings are formed in the third dielectric layer, a conductive material is filled in the openings to form a plurality of metal lines in the third dielectric layer.

Figure 19:
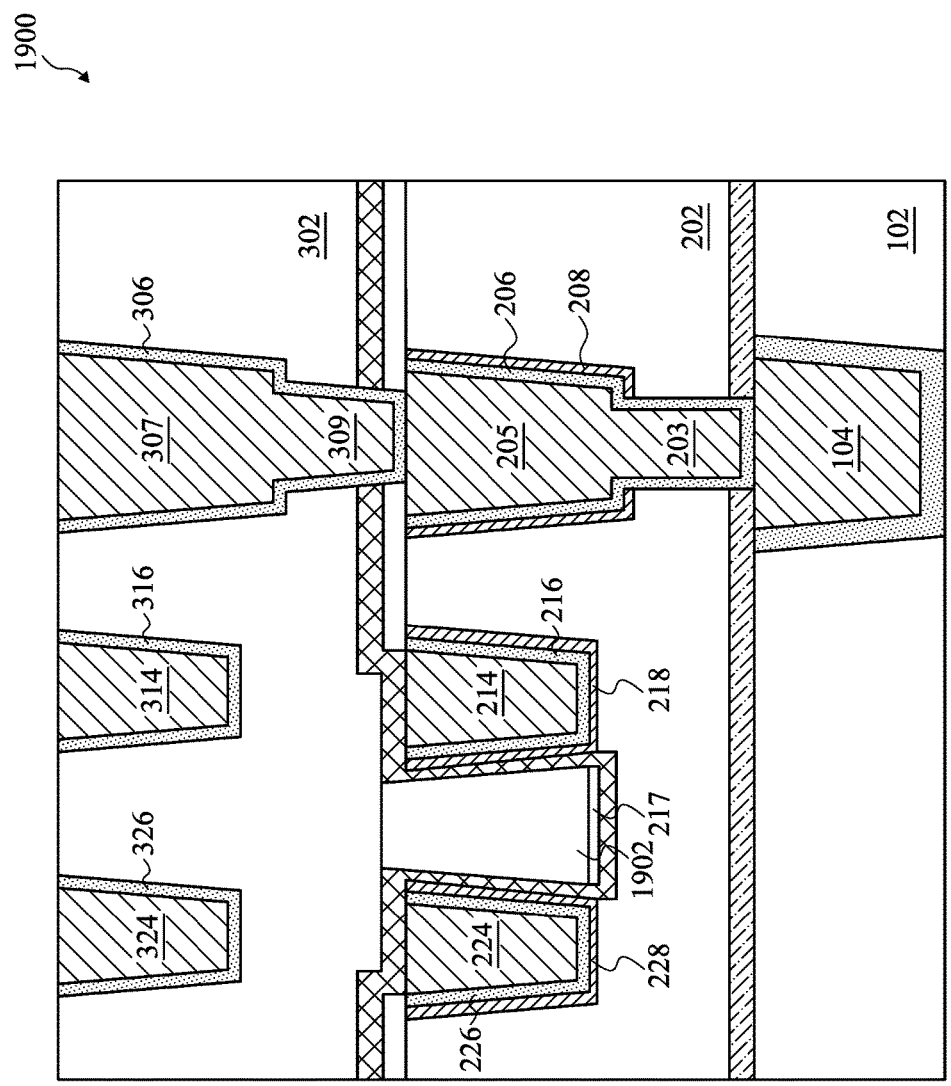
FIG. 19 illustrates a cross sectional view of another semiconductor device with an air gap in accordance with another embodiment of the present disclosure.

FIG. 19 illustrates a cross sectional view of another semiconductor device with an air gap in accordance with another embodiment of the present disclosure. The air gap 1902 of the semiconductor device 1900 shown FIG. 19 is similar to the air gap 215 shown in FIG. 1 except that some dielectric materials may fall through the narrow gap between two adjacent metal lines 214 and 224 during the dielectric deposition process shown in FIG. 17. As a result, a dielectric bottom layer 217 is formed in the air gap 1902. In some embodiments, the top surface of the dielectric bottom layer 217 is level with a bottom surface of the protection layer 218 as shown in FIG. 19.

Figure 20:
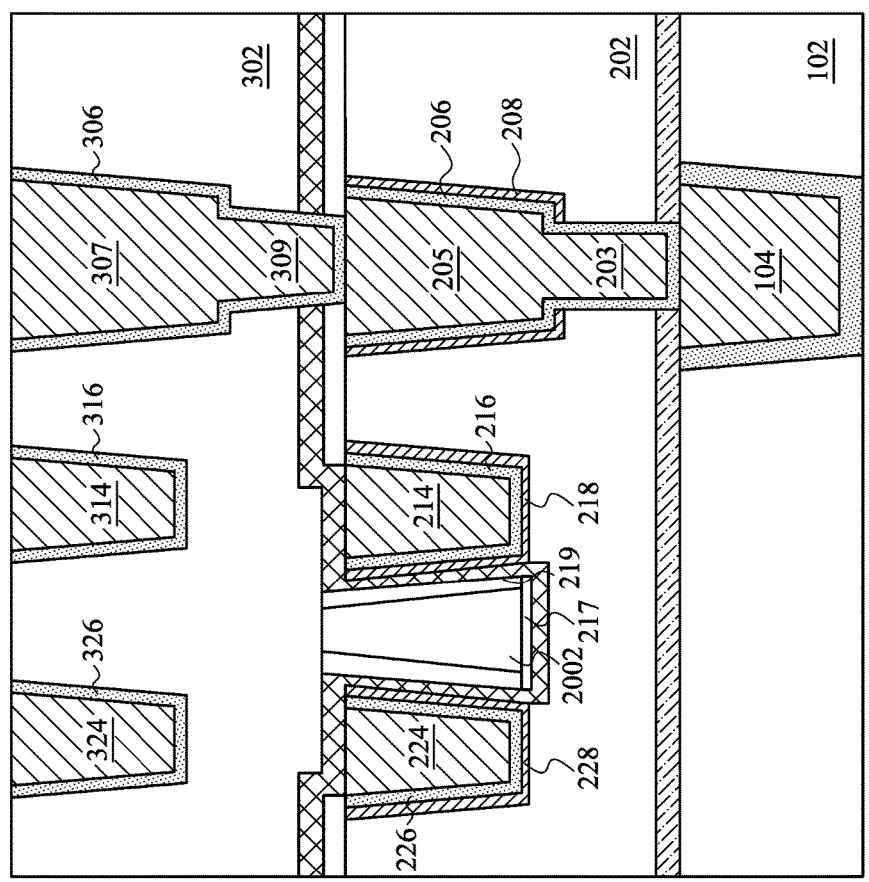
FIG. 20 illustrates a cross sectional view of yet another semiconductor device with an air gap in accordance with another embodiment of the present disclosure.

FIG. 20 illustrates a cross sectional view of yet another semiconductor device with an air gap in accordance with another embodiment of the present disclosure. The air gap 2002 of the semiconductor device 2000 shown FIG. 20 are similar to the air gap 1902 shown in FIG. 91 except that two dielectric sidewalls 219 are formed in the air gap 2002 during the dielectric deposition process shown in FIG. 17.

In accordance with an embodiment, a device comprises an air gap between a first metal line and a second metal line in a first dielectric layer, wherein the first metal line and the first dielectric layer are separated by a first protection layer and the second metal line and the first dielectric layer are separated by a second protection layer, and a first metal structure in the first dielectric layer, wherein an upper portion of the first metal structure and the first dielectric layer are separated by a third protection layer, and wherein the first protection layer, the second protection layer and the third protection layer are formed of a same material.

In accordance with an embodiment, a device comprises a first protection layer over sidewalls and a bottom of a first trench in a first dielectric layer, a first barrier layer over the first protection layer, a first metal line in the first trench, a second protection layer over sidewalls and a bottom of a second trench in the first dielectric layer, a second barrier layer over the second protection layer, a second metal line in the first trench, an air gap between the first trench and the second trench and a third protection layer over sidewalls of a third trench in the first dielectric layer, wherein the first protection layer, the second protection layer and the third protection are formed of a same material.

In accordance with an embodiment, a method comprises forming a first trench, a second trench and a third trench in a first dielectric layer over a substrate, depositing a protection layer in the first trench, the second trench and the third trench, forming a via trench at a bottom of the third trench, depositing a barrier layer in the first trench, the second trench, the third trench and the via trench, plating a first conductive material in in the first trench, the second trench, the third trench and the via trench to form a first metal line in the first trench, a second metal line in the second trench, applying an etching process to the first dielectric layer to form an air gap trench between the first metal line and the second metal line, wherein the air gap trench extends from a sidewall of the protection layer in the first trench to a sidewall of the protection layer in the second trench and depositing a second dielectric layer over the first dielectric layer to form an air gap between the first metal line and the second metal line.

In accordance with an embodiment, a method includes forming a second dielectric layer over a first dielectric layer, the first dielectric layer having a first metal feature formed therein. The method also includes forming a first opening and a second opening in the second dielectric layer. The method further includes depositing a first protection layer in the first opening and a second protection layer in the second opening, where the first protection layer lines the first opening and the second protection layer lines the second opening. A first barrier layer is deposited in the first opening and a second barrier layer in the second opening, where the first barrier layer lines the first protection layer in the first opening and the second barrier layer lines the second protection layer in the second opening. A first conductive material is deposited in the first opening and the second opening to form a first metal line in the first opening and a second metal line in the second opening. The second dielectric layer is etched to form an air gap trench interposed between the first metal line and the second metal line, where the air gap trench has a first sidewall including a portion of the first protection layer and a second sidewall including a portion of the second protection layer. The method also includes depositing a third dielectric layer over the first dielectric layer to form an air gap between the first metal line and the second metal line.

In accordance with an embodiment, a method includes etching a plurality of trenches in a first dielectric layer and lining the plurality of trenches with a protective layer. After lining the plurality of trenches with the protective layer, the method lines the plurality of trenches with a barrier layer. A first conductive material is deposited in the plurality of trenches and over the first dielectric layer. The first conductive material and an upper portion of the first dielectric layer is planarized to separate the first conductive material in each of the plurality of trenches to form respective metal features in the plurality of trenches. An air gap trench is etched between a first metal feature of the respective metal features and a second metal feature of the respective metal features, the first metal feature being adjacent to the second metal feature, where the protective layer of the first metal feature protects the barrier layer of the first metal feature and the protective layer of the second metal feature protects the barrier layer of the second metal feature during etching the air gap trench. A second dielectric layer is deposited over the air gap trench to form a first air gap in the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 forming a first trench, a second trench, and a third trench in a first dielectric layer over a substrate, the first dielectric layer being a single continuous layer, wherein a bottom surface of the first trench and a bottom surface of the second trench are disposed between an upper surface of the first dielectric layer and a lower surface of the first dielectric layer, wherein the bottom surface of the first trench and the bottom surface of the second trench comprises the first dielectric layer;
 depositing a protection layer in the first trench, the second trench, and the third trench, the protection layer lining the first trench, the second trench, and the third trench;

after depositing the protection layer, depositing a photoresist layer in the first trench, the second trench, the third trench;
patterning the photoresist layer;
applying an etching process to form a via trench extending through the protection layer and through the first dielectric layer at a bottom of the third trench;
depositing a barrier layer in the first trench, the second trench, the third trench, and the via trench;
plating a first conductive material in the first trench, the second trench, the third trench, and the via trench to form a first metal line in the first trench, a second metal line in the second trench, and a metal via extending from the via trench through the third trench;
etching the first dielectric layer to form an air gap trench between the first metal line and the second metal line, wherein the air gap trench extends laterally from a sidewall of the protection layer in the first trench to a sidewall of the protection layer in the second trench; and
depositing a second dielectric layer over the first dielectric layer to form an air gap between the first metal line and the second metal line.

2. The method of claim 1, further comprising:
prior to etching the first dielectric layer to form the air gap trench, depositing a hard mask layer over the first dielectric layer; and
patterning the hard mask layer to expose the first dielectric layer between the first trench and the second trench.

3. The method of claim 1, further comprising:
forming a plurality of trenches in the second dielectric layer;
depositing a second barrier layer in the plurality of trenches; and
plating a second conductive material in the plurality of trenches to form a plurality of metal lines.

4. The method of claim 1, further comprising:
prior to depositing the second dielectric layer over the first dielectric layer to form the air gap between the first metal line and the second metal line, depositing a liner layer in the air gap trench.

5. The method of claim 1, further comprising:
after the step of plating the first conductive material in in the first trench, the second trench, the third trench, and the via trench, applying a chemical mechanical polish process to the first conductive material over a top surface of the first dielectric layer.

6. The method of claim 1, wherein the metal via is a first metal via, further comprising:
forming a fourth trench in the second dielectric layer over the first metal via; and
forming a second metal via in the fourth trench, the second metal via electrically coupled to the first metal via.

7. The method of claim 1, wherein the barrier layer surrounds the metal via and extends to a lower portion of the metal via further than the protection layer.

8. The method of claim 1, wherein the protection layer comprises a first material, the first material comprising: a dielectric material, a metal oxide, a metal nitride, or a combination of a metal, oxygen, and nitrogen.

9. A method, comprising:
forming a second dielectric layer over a first dielectric layer, the first dielectric layer having a first metal feature formed therein;
forming a first opening, a second opening, and a third opening in the second dielectric layer;
depositing a first protection layer in the first opening, a second protection layer in the second opening, and a third protection layer in the third opening, the first protection layer lining the first opening, the second protection layer lining the second opening, and the third protection layer lining the third opening;
extending a bottom of the third opening to expose the first metal feature and form an extended third opening;
depositing a first barrier layer in the first opening, a second barrier layer in the second opening, and a third barrier layer in the extended third opening, the first barrier layer lining the first protection layer in the first opening, the second barrier layer lining the second protection layer in the second opening, the third barrier layer lining the third protection layer in an upper portion of the third opening, and the third barrier layer lining the second dielectric layer in an extended portion of the third opening;
depositing a first conductive material in the first opening and the second opening to form a first metal line in the first opening and a second metal line in the second opening;
depositing the first conductive material in the extended third opening to form a first metal via in the extended third opening;
forming a mask over the first metal line and the second metal line;
patterning the mask to expose a portion of the first metal line, the second metal line, and a portion of the second dielectric layer interposed between the first metal line and the second metal line;
using the mask and the exposed portions of the first metal line and the second metal line as an etch mask, etching the second dielectric layer to form an air gap trench interposed between the first metal line and the second metal line, the air gap trench having a first sidewall comprising a portion of the first protection layer and a second sidewall comprising a portion of the second protection layer; and
depositing a third dielectric layer over the second dielectric layer to form an air gap between the first metal line and the second metal line.

10. The method of claim 9, further comprising:
prior to depositing the third dielectric layer, depositing a liner layer in the air gap trench, the liner layer extending over the first metal line and the second metal line.

11. The method of claim 10, wherein depositing the third dielectric layer includes depositing material of the third dielectric layer in the air gap trench on the liner layer.

12. The method of claim 9, wherein the first protection layer and second protection layer are a first material, the first material comprising: a dielectric material, a metal oxide, a metal nitride, or a combination of a metal, oxygen, and nitrogen.

13. The method of claim 12, wherein the first barrier layer and second barrier layer are a second material, the second material comprising a metal, metal oxide, or metal nitride, wherein the second material is a different material than the first material.

14. The method of claim 9, further comprising:
prior to etching the second dielectric layer to form the air gap trench, depositing a hard mask layer over the second dielectric layer; and
patterning the hard mask layer to expose the second dielectric layer between the first metal line and the second metal line, wherein etching the second dielectric to form the air gap trench comprises using the hard mask layer as an etch mask.

15. The method of claim 9, further comprising:

after the step of depositing the first conductive material in in the first opening, the second opening, and the extended third opening, applying a chemical mechanical polish process to the first conductive material over a top surface of the second dielectric layer.

16. A method, comprising:

etching a plurality of trenches in a first dielectric layer, the first dielectric layer being a single continuous layer, a depth of each of the plurality of trenches being less than a thickness of the first dielectric layer;

lining the plurality of trenches with a protective layer, the protective layer comprising a first material, the first material comprising: a dielectric material or a combination comprising metal at a concentration of 20% and 70%, oxygen at a concentration of 0% to 80%, and nitrogen at a concentration between 0% and 80%;

after the lining the plurality of trenches with the protective layer, lining the plurality of trenches with a barrier layer;

depositing a first conductive material in the plurality of trenches and over the first dielectric layer;

planarizing the first conductive material and an upper portion of the first dielectric layer to separate the first conductive material in each of the plurality of trenches to form respective metal features in the plurality of trenches;

etching an air gap trench between a first metal feature of the respective metal features and a second metal feature of the respective metal features, the first metal feature being adjacent to the second metal feature, wherein the protective layer of the first metal feature protects the barrier layer of the first metal feature and the protective layer of the second metal feature protects the barrier layer of the second metal feature during etching the air gap trench;

depositing a liner layer in the air gap trench, the liner layer extending over the first metal feature and the second metal feature, wherein the liner layer comprises a second material, the second material comprising: a dielectric material, a metal oxide, a metal nitride, or a combination of a metal, oxygen, and nitrogen; and depositing a second dielectric layer over the air gap trench to form a first air gap in the first dielectric layer.

17. The method of claim 16, further comprising:

prior to lining the plurality of trenches with the barrier layer, etching a via opening in one or more of the plurality of trenches, the via opening exposing an underlying metal feature, wherein lining the plurality of trenches with the barrier layer includes lining the via opening with the barrier layer, and wherein depositing the first conductive material in the plurality of trenches includes depositing the first conductive material in the via opening.

18. The method of claim 17, further comprising:

prior to etching the via opening, depositing a photoresist layer in the plurality of trenches; and patterning the photoresist layer, wherein the etching is through the patterned photoresist layer.

19. The method of claim 17, wherein the protective layer does not extend into the via opening.

20. The method of claim 16, wherein depositing the second dielectric layer includes depositing material of the second dielectric layer in the air gap trench on the liner layer.

* * * * *